United States Patent [19]

Ikeda et al.

[11] Patent Number: 5,431,773

[45] Date of Patent: Jul. 11, 1995

[54] METHOD OF MANUFACTURING SEMICONDUCTOR DEVICE

[75] Inventors: Mitsushi Ikeda; Michio Murooka, both of Tokyo, Japan

[73] Assignee: Kabushiki Kaisha Toshiba, Kanagawa, Japan

[21] Appl. No.: 991,954

[22] Filed: Dec. 17, 1992

[30] Foreign Application Priority Data

Dec. 18, 1991 [JP] Japan .................................. 3-334969

[51] Int. Cl.$^6$ ............................................... C23F 1/00
[52] U.S. Cl. ..................................... 216/23; 437/228; 216/41; 216/58; 216/76
[58] Field of Search ................ 157/643, 646, 667, 656; 359/74, 79, 87; 437/192, 195, 228, 235

[56] References Cited

U.S. PATENT DOCUMENTS

| | | | |
|---|---|---|---|
| 4,158,613 | 6/1979 | Sogo | 437/194 X |
| 4,687,544 | 8/1987 | Bersin | 156/646 X |
| 4,711,698 | 12/1987 | Douglas | 156/643 |
| 4,718,976 | 1/1988 | Fujimura | 156/643 |
| 4,789,645 | 12/1988 | Calviello et al. | 437/192 X |
| 4,929,059 | 5/1990 | Takahashi | 359/74 X |
| 5,098,860 | 3/1992 | Chakravorty et al. | 437/195 |

FOREIGN PATENT DOCUMENTS

0418540A2  8/1990  European Pat. Off. .
183125     7/1989  Japan .

OTHER PUBLICATIONS

D. E. Ibbotson et al., "Selective interhalogen etching of tantalum compounds and other semiconductor materials", Applied Physics Letters, vol. 46, No. 8, Apr. 15, 1985, New York.

JP 1283524, Suzuki Katsumi et al., "Liquid Crystal Display Device", Patent Abstracts of Japan, vol. 14, No. 59, Feb. 2, 1990.

JP 58064062, Shiraki Hiroyuki, "Semiconductor Memory", Patent Abstracts of Japan, vol. 7, No. 154, Jul. 6, 1983.

Yue Kuo, "Reaction Ion Etching of Sputter Deposited Tantalum Oxide and Its Etch Selectivity to Tantalum", Journal of the Electrochemical Society, vol. 139, No. 2, Feb. 1992, Manchester, N.H.

H. Okano, et al., "Down-Flow Process in VLSI Manufacturing", Extended Abstracts of the 20th (1988 International) Conference on Solid State Device and Materials, Aug. 24, 1988, Tokyo, pp. 549–552.

"Reactive Ion Etching of Tantalum Pentoxide", Shunji Seki et al., Journal Journal of the Electrochemical Society, pp. 2505–2506, 1983.

"A New Etchant for Thin Films of Tantalum and Tantalum Compounds", J. Grossman et al., Journal of the Electrochemical Society, p. 674, 1969.

Primary Examiner—Thi Dang
Attorney, Agent, or Firm—Finnegan, Henderson, Farabow, Garrett & Dunner

[57] ABSTRACT

A method of manufacturing a semiconductor device, which comprises steps of providing a substrate, forming an oxide layer of a metal material, which includes a tantalum or an alloy mainly containing a tantalum on the substrate, placing the substrate into a first chamber, activating an etching gas which includes a fluorine containing gas and an oxygen containing gas, in a second chamber, introducing the activated etching gas into the second chamber, and etching the oxide layer by the introduced gas selectively against the substrate. A method of manufacturing a liquid crystal display device, which comprises steps of providing a substrate, forming an anodic oxide layer of a tantalum containing material on the substrate, forming an etching mask on the anodic oxide layer, placing the substrate into a first region, activating a mixture of fluorine and oxygen containing gas in a second region, apart from the first region, introducing the activated etching gas into the first region through a gas introducing portion, and etching the oxide layer on the substrate selectively against the substrate, by using the etching mask.

20 Claims, 8 Drawing Sheets

METHOD OF MANUFACTURING SEMICONDUCTOR DEVICE

BACKGROUND OF THE INVENTION

1. Field of the Invention

This invention relates to a method of manufacturing a semiconductor device, and, more particularly, to such a method which includes a patterning process for etching an oxide layer on a metal material.

2. Description of the Related Art

Recently, semiconductor display devices have been developed which employ an active matrix type liquid crystal display (LCD) using a thin film transistor (TFT) as a switching device. The LCD is comprised of a TFT array using an amorphous silicon (a-Si) layer capable of being formed on a cheap glass substrate to provide a large scale, high density, high quality picture. Also, such remarkable flat panel displays can be provided at relatively low costs.

The LCD is comprised of an array of TFTs (or pixels) and, as shown in FIG. 1, each such TFT (Tr) is provided at a crossover point between each of a plurality of address lines (A1, A2, ... An) and each of a plurality of data lines (Di, D2, ... Dn). Each TFT (Tr), as shown, includes three electrodes, one of which is connected to a pixel electrode of liquid crystal cell (LC) and which also forms an electrode of a storage capacitance (Cs), another of which is connected to a data line, and the third of which is connected to an address line. Although not shown in FIG. 1, insulating layers are provided between the address lines and the data lines as well as between the pixel electrode and the Cs line.

In this structure of the TFT array, if there is an electrical short between an address line and a data line, line defects are caused in the two shorted lines. If an electrical short occurs between a pixel electrode and the Cs line of that TFT, a point defect is caused.

To prevent these kinds of electrical shorts, a method has been proposed in which an anodic oxide layer, devoid of pin holes, is used to cover the surfaces of the address lines and the Cs lines. According to the proposed method, a part of the anodic oxide, which is to be a contact portion connected to driving circuits of an address line or a data line, must be etched. Alternatively the contact portion is covered by a resist material to prevent the formation of an anodic oxide layer thereon. With this latter method, one extra photolithography process is necessary to form contact portion. From the standpoint of manufacturing costs, the former method is more desirable than the latter method. To achieve the former etching method, a selective etching of only the anodic oxide layer on the metal material of the address line and the data line must be carried out. Conventionally, a tantalum (Ta), a molybdenum-tantalum (Mo—Ta) alloy, and a tungsten-tantalum (W—Ta) alloy are used as the metal material, but an effective method for selectively etching the anodic oxide layer of these materials, without also etching the metal thereof, has not been known.

Reactive ion etching of these metals and the oxides thereof has been proposed. For example, a method of a reactive ion etching (RIE) of tantalum, by using a $CF_4$ gas or a $CCl_4$ gas was reported by Somekhard et al., Applied Optics: 1977, p. 126. A method of reactive ion etching TaOx, by using a gas mixture of $CF_4$ and $O_2$ or $CF_4$ and $H_2$ was reported by Seki et al., Journal of Electrochemical Society, 1983, p. 2505.

However, a selective etching of the anodic oxide layer with an etching rate ratio more than one, e.g., $Ta_2O_5$ on the metal material, e.g., Ta, has not been known, because the selective etching of $Ta_2O_5$ as against Ta is generally difficult to accomplish. Also, even in a wet etching method, a selective etching of $Ta_2O_5$ on Ta has not been known.

As described above, in the conventional method, it is difficult to etch the anodic oxide layer on the metal material selectively with an etching rate ratio more than one. Therefore, the manufacture of semiconductor device which uses an anodic oxide layer as an insulating layer has been limited.

SUMMARY OF THE INVENTION

The present invention has been made in view of the above circumstances and has as an object to provide a method of a manufacturing semiconductor device, the method which can selectively etch an anodic oxide layer against a metal material, such as a $Ta_2O_5$ layer on a Ta layer.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the method of manufacturing a semiconductor device, of this invention comprises steps of providing a substrate forming an oxide layer of a metal material which includes a tantalum or an alloy mainly containing a tantalum on the substrate; placing the substrate into a first chamber, activating an etching gas which includes a fluorine containing gas and an oxygen containing gas in a second chamber, introducing the activated etching gas into the second chamber, and selectively etching the oxide layer by the introduced gas against the substrate. An alloy mainly containing tantalum implies an alloy containing more than half of tantalum in atomic percentage.

There is also provided a method of manufacturing a semiconductor device, which comprises steps of providing a substrate; forming an anodic oxide layer of a tantalum containing material on the substrate, forming an etching mask on the anodic oxide layer, placing the substrate into a first region, activating a mixture of fluorine and oxygen containing gas in a second region, apart from the first region, introducing the activated etching gas into the first region through a gas introducing portion, and etching the oxide layer on the substrate selectively against the substrate, by using the etching mask.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

Figure 1:
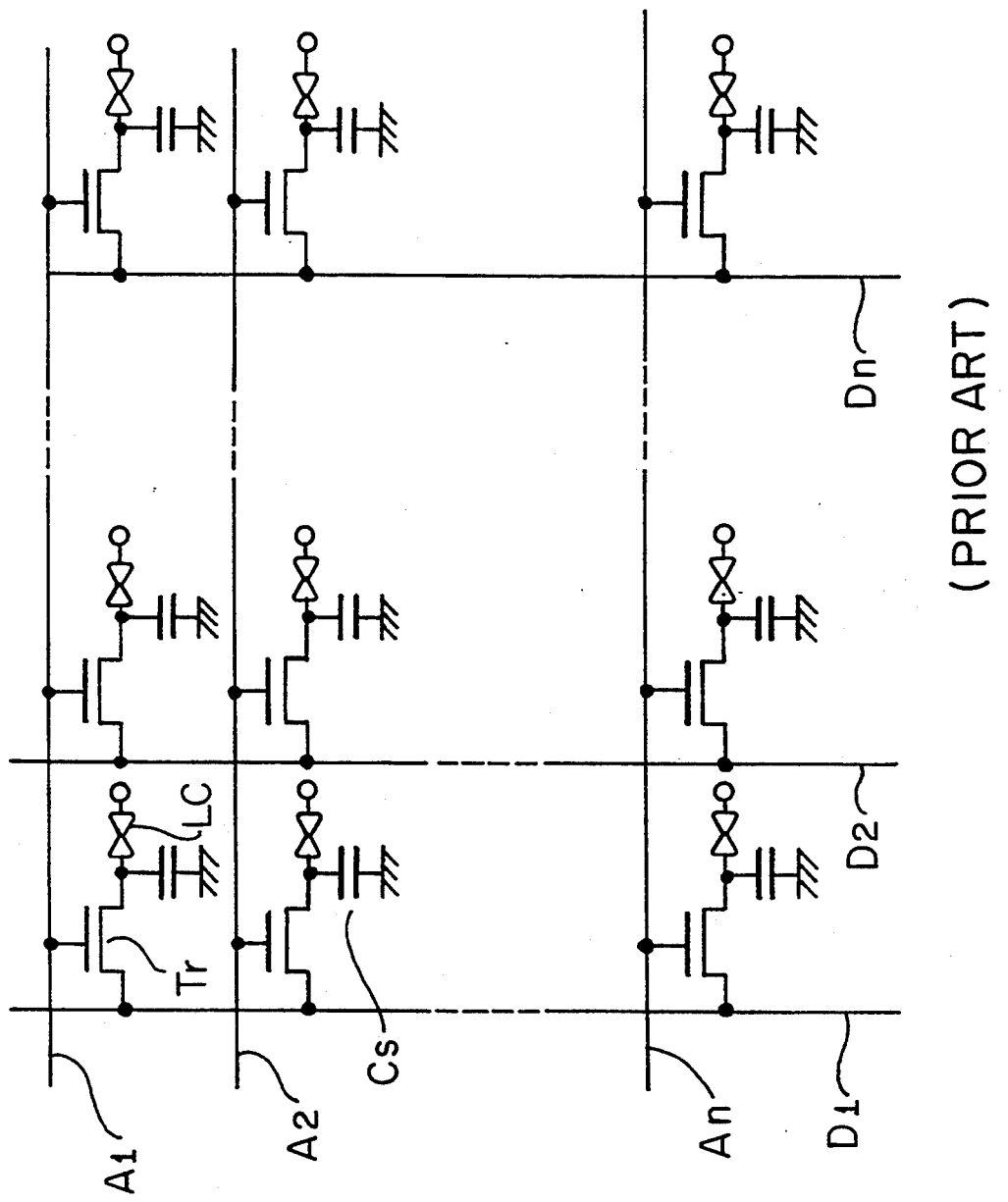
FIG. 1 is a partial circuit diagram of a conventional LCD comprised of a TFT array.
Figure 2:
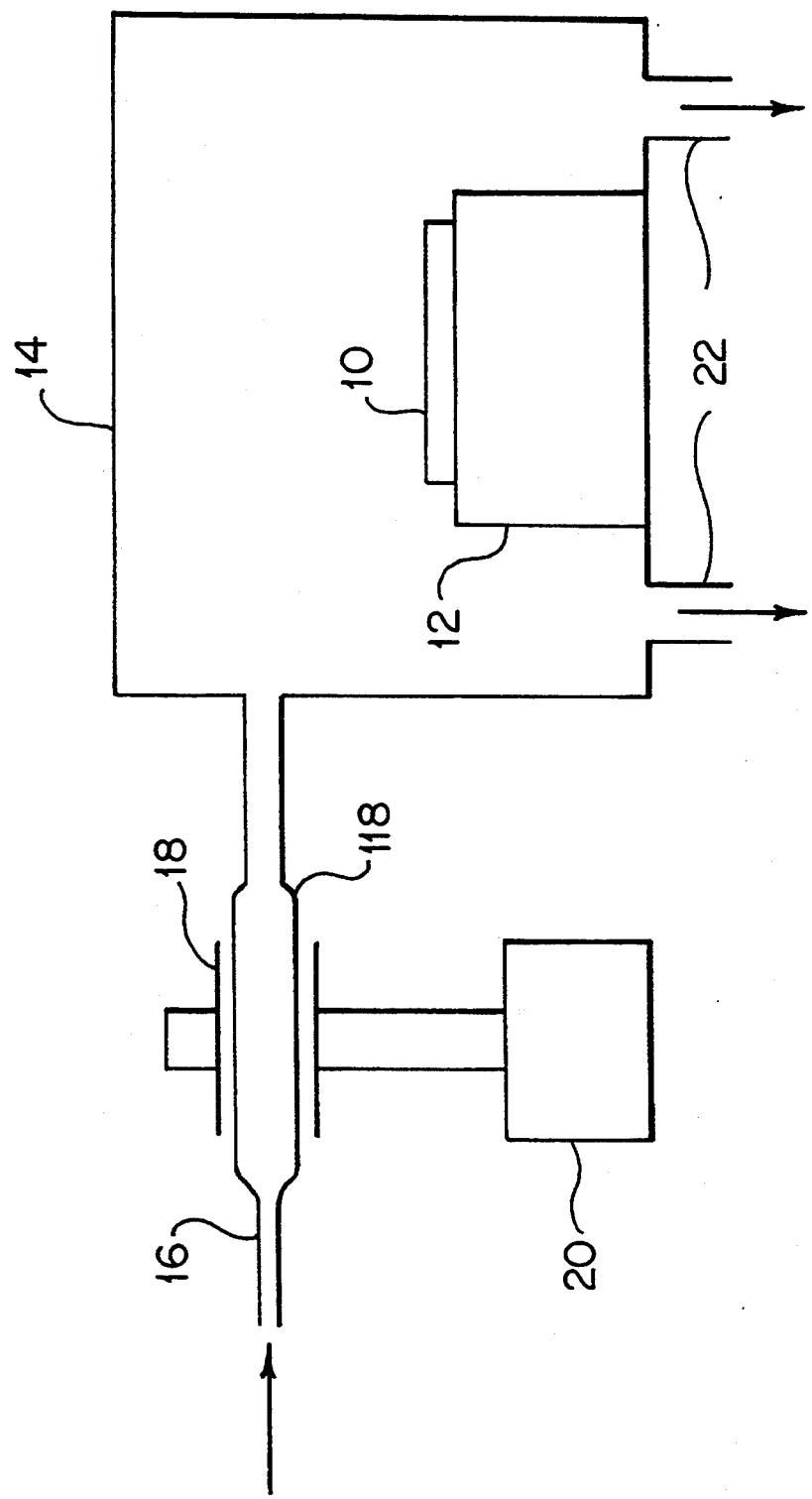
FIG. 2 is a schematic sectional view showing an etching apparatus used in the practice of the invention.

A schematic sectional view of an etching apparatus used in the practice of the invention, is shown in FIG. 2 of the accompanying drawings. The illustrated apparatus is a so-called down flow type of chemical dry etching (CDE) apparatus.

A composite 10, including metal and a metal oxide to be etched, is placed on a holder 12 in a chamber 14. For example, the composite may be in the form of a substrate made of silicon (Si) or silica ($SiO_2$) with a layer of tantalum (Ta) and a layer of tantalum oxide ($Ta_2O_5$) formed thereon by an anodic oxidation or a thermal oxidation. The composite may take other multilayer forms, however, such as a layer of metal like Ta and an oxide of that metal, in which selective etching of one layer, as against the other layer, is desired. An etching gas is introduced into the chamber 14 through a tube 16 and a microwave discharge tube 18 is provided outside of the tube 118 at a location spaced from the chamber 14. A microwave power source 20 is connected to discharge tube 18. The etching gas to be supplied through tube 16 is activated at discharge tube 18 and electrically neutral active species of the etching gas are selectively introduced into chamber 14.

For example, if a gas mixture of $CF_4$ and $O_2$ is used as the etching gas, radicals, such as $CF_3^*$, $CF_2^*$, $CF^*$, $F^*$, and $O^*$, are generated by discharge tube 18 and are introduced into chamber 14. This is possible because the radicals have a life time long enough to be carried in the tube 16 from the discharge tube 18 to the chamber 14. Ions, such as $CF_x^+$, or electrons are also generated by the discharge tube, but have a sufficiently short life that they are not carried into the chamber 14. An important feature of the CDE apparatus, is that only electrical neutral radicals activated by the discharge tube and carried into the chamber, are used for etching.

The residual etching gas is exhausted through exhausting tubes 22. The etching gas is introduced into chamber 14 after the inner space of chamber 14 is fully evacuated by a vacuum pump (not shown) through the exhaust tube 22. The inner space of the chamber is set to a desired pressure in the etching process.

Data obtained through experiments conducted with the etching apparatus shown in FIG. 2 is represented by graphs shown in FIGS. 3–6.

Figure 3:
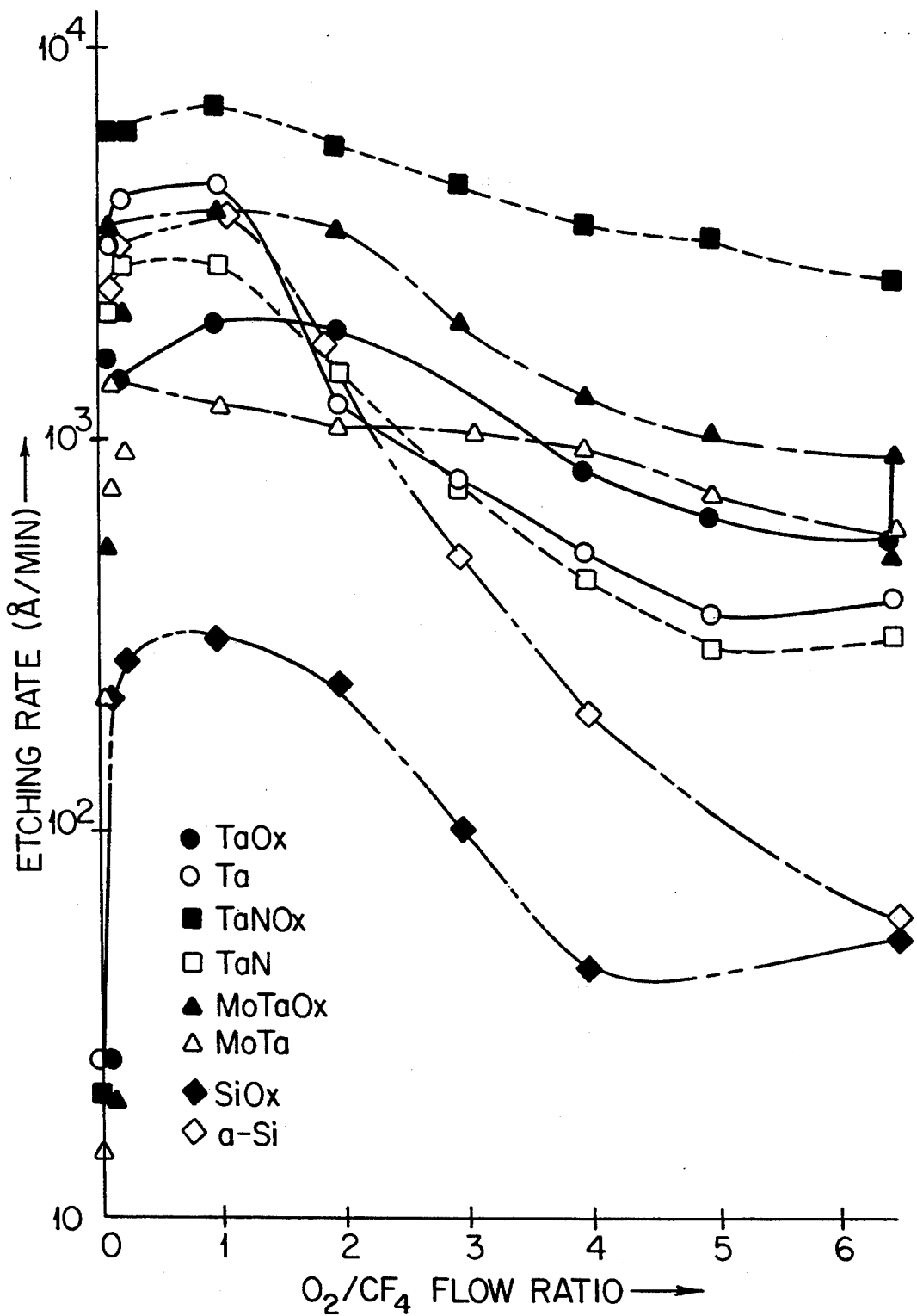
FIGS. 3 to 6 are graphs to explain performance characteristics of the apparatus shown in FIG. 2.

Thus, the graph of FIG. 3 shows the etching rate of various materials, such as TaOx, Ta, TaNOx, TaN, MoTaOx, MoTa, $SiO_2$, and a-Si (PCVD deposited amorphous silicon), as against a flow ratio of $O_2/CF_4$. The data shown was obtained in a first experiment carried out under conditions of a substrate temperature of 100° C., 180 sccm (standard cubic centimeter per minute) of $CF_4$ flow rate, and 600 W of microwave power.

According to FIG. 3, a selective etching rate ratio or "selectivity" of TaOx/Ta was more than 1 or about 2, when an $O_2/CF_4$ ratio was more than 2. A selectivity of TaNOx/TaN was more than 2 in the full range of $O_2/CF_4$ ratios and a high selectivity more than 6 was obtained when $O_2/CF_4$ ratio was more than 2. A selectivity of MoTaOx/MoTa was more than 1 in the full range of $O_2/CF_4$ ratios and a high selectivity more than 2 was obtained when $O_2/CF_4$ rations were from 1 to 2. A Si as against TaOx has selectivity more than one in the full range of $O_2/CF_4$ ratios and a high selectivity more than 2 was obtained when $O_2/CF_4$ ratios were more than 3. Also, photoresist layer (not shown) had sufficient selectivities against TaOx in the full range of $O_2/CF_4$ ratios. When more than 1 $\mu$m which is several times thicker than oxide layer, thick resist layer remained after the TaOx etching completion.

Figure 4:
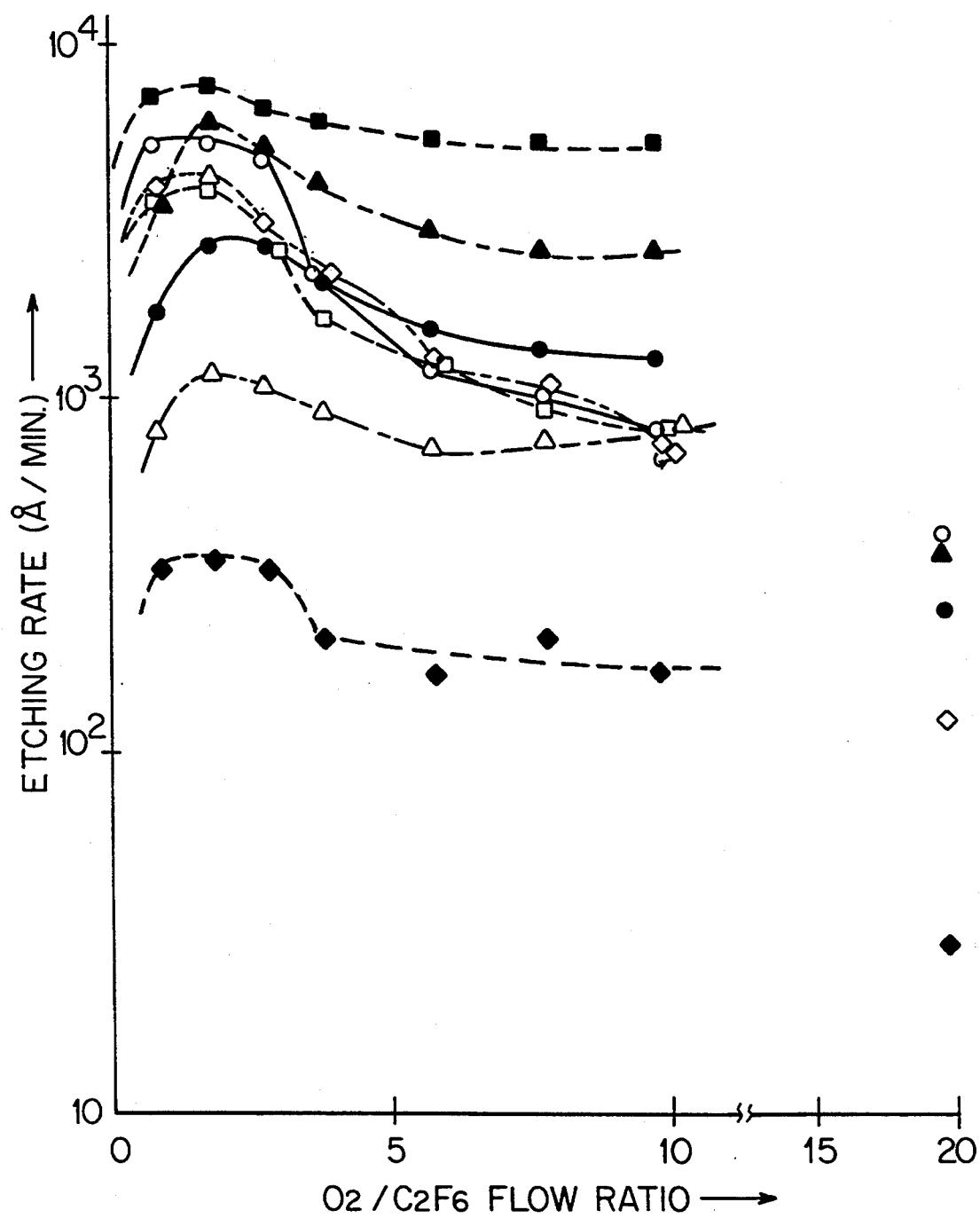

In FIG. 4, the etching rate of the various materials, the symbols are the same as those of the first experiment, are plotted against a flow ratio of $O_2/C_2F_6$. This second experiment used $C_2F_6$ gas, different from the first experiment, and was carried out under conditions of a substrate temperature of 100° C., a $C_2F_6$ flow rate of 150 sccm, and 600 W of microwave power.

As is apparent from FIG. 4, a selectivity ratio of TaOx/Ta more than 2 was obtained, with an $O_2/C_2F_6$ ratio more than 4. A selectivity ratio of TaNOx/TaN was more than 1 against the full range of flow ratios, and the selectivity of more than 3 was obtained with a flow ratio more than 2. A selectivity for MoTaOx/MoTa of more than 4 was obtained for all ranges of flow ratio. A resist (photoresist; not shown) had a selectivity against either metal or metal oxide is used as an etching mask.

For the cases of FIGS. 3 and 4, the selectivity of TaNOx/TaN varies as the composition and the selectivity increases as the increase of N content. For MoTaOx/MoTa, the composition was 65% Ta and 35% Mo in this case, but similar selectivity was obtained for other compositions.

Figure 5:
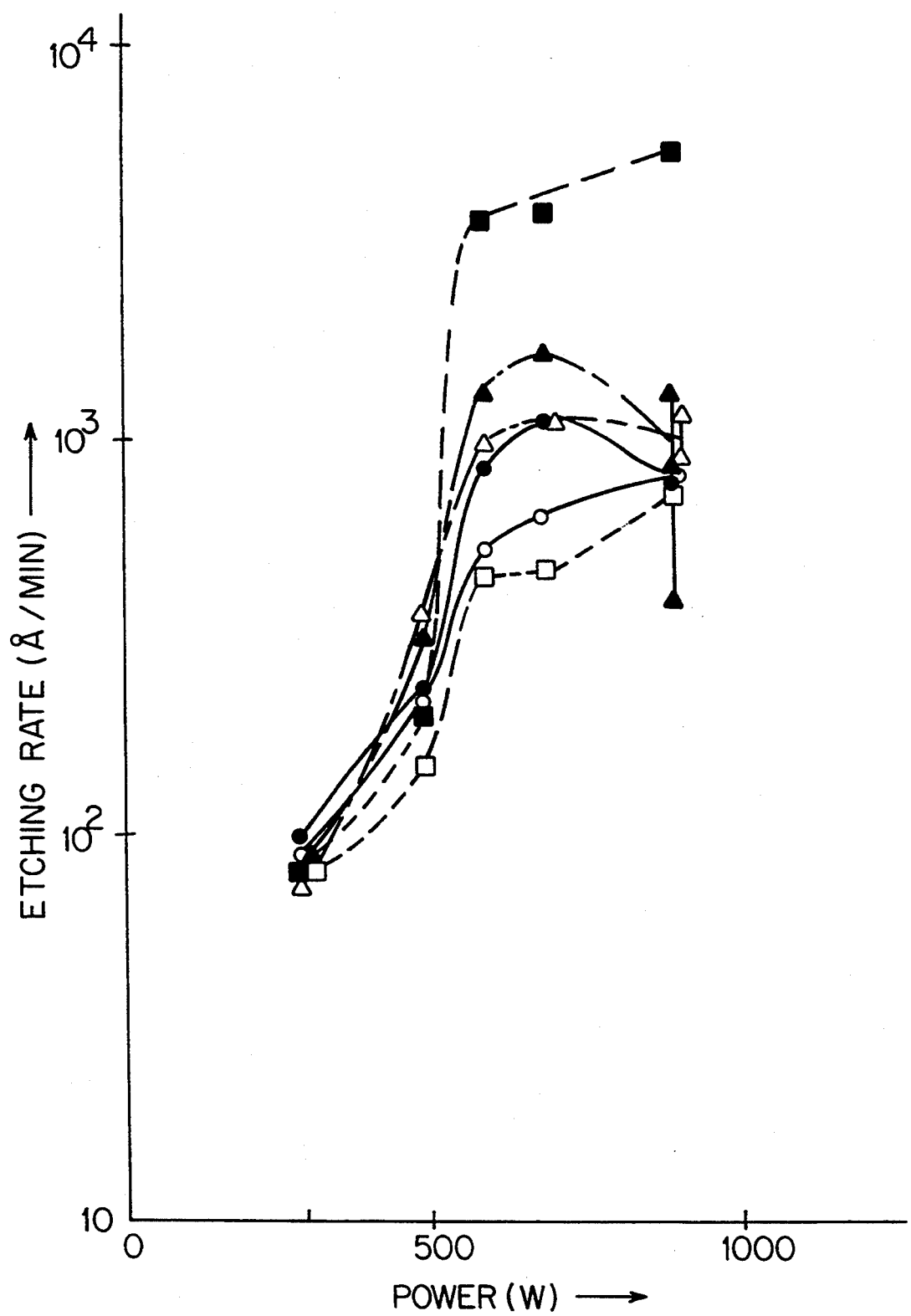

The graph of FIG. 5 shows an etching rate of the various materials, similar to those used in the first experiment, against a microwave power. A temperature of the substrate was 100° C., the flow rate of $CF_4$ was 180 sccm, and the flow rate of $O_2$ was 720 sccm. It is apparent from FIG. 5 that when the microwave power was 600 to 800 W, a selective etching of anodic oxide layers against metal materials could be achieved. Even in a 500 W of microwave power, TaOx/Ta or TaNOx/TaN could realize the selective etching.

Figure 6:
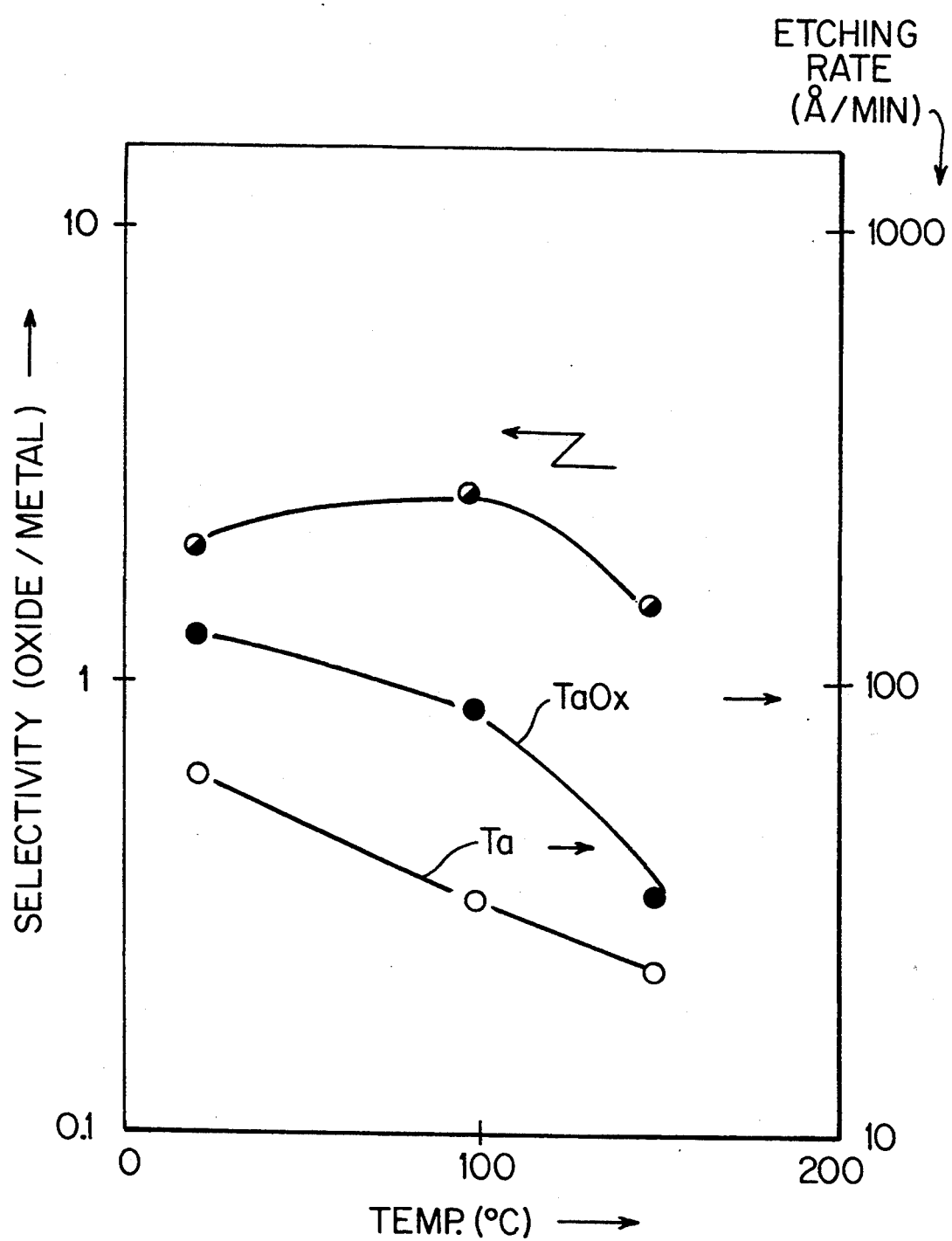

The graph of FIG. 6 shows a selectivity (Oxide/Metal) and an etching rate against temperature in the chamber 14. The data shown in FIG. 6 was obtained with a $CF_4$ flow rate of 180 sccm, an $O_2$ flow rate of 900 sccm, a microwave power of 600 W, and a pressure of 300 pa. According to the graph of FIG. 6, a selectivity more than 2 was obtained in the range of from room temperature to 150° C., and probably up to 180° C. Etching pressures from 30 Pa to 300 Pa can be used for selective etching.

Figure 7A:
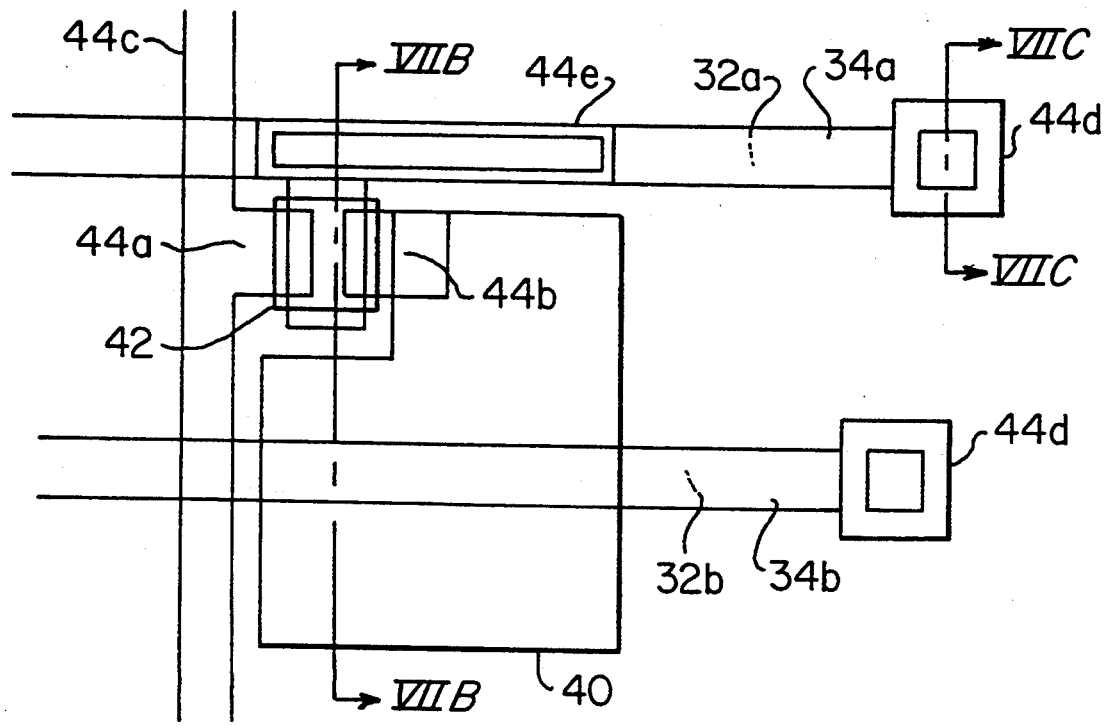
FIG. 7(a) is a fragmentary plan view illustrating a semiconductor device formed in a first embodiment of the invention.
Figure 7B:
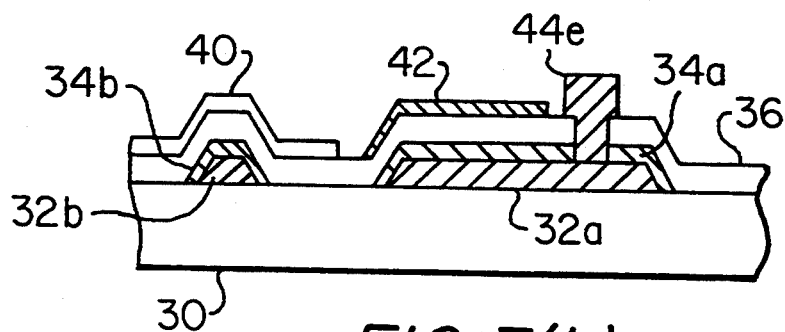
FIG. 7(b) is a fragmentary cross section on line VIIB—VIIB of FIG. 7(a)
Figure 7C:
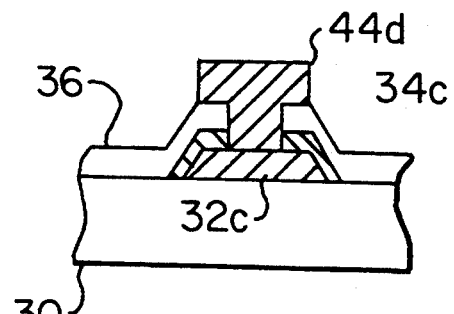
FIG. 7(c) is a fragmentary cross section on line VIIC—VIIC of FIG. 7(a)

The present invention is based in substantial part on information gained from the above-described experiments and may be understood more completely from the detailed description of exemplary embodiments to follow. A first such embodiment of the invention is applicable, for example, to the manufacture of a liquid crystal display device and will be described with reference to FIGS. 7(a), 7(b) and 7(c) of the drawings.

As shown in these figures, a tantalum layer 32 is formed by a sputtering method on a glass substrate 30 and patterned to form an address line 32a, a Cs line 32b, and a contact portion 32c. The exposed surfaces of the patterned tantalum are immersed in citric acid liquid and are oxidized at a constant current, e.g., 0.5 mA/cm$^2$, at a voltage of up to 150 V. After constant current oxidation, the patterned tantalum is oxidized at a constant voltage, e.g., 150 V, and 300 nm of TaOx anodic oxide layers 34a, 34b, and 34c are formed on the surfaces of the tantalum. After the TaOx anodic oxide layers are so formed, a 300 nm SiOx layer 36, a 350 nm a-Si layer and 50 nm n+ a-Si layer are successively formed by the well known plasma CVD method, and an a-Si island 42 is formed by patterning the stacked a-Si layer. Next, a 100 nm ITO layer 40 is sputtered to form a TFT electrode 40. A part of SiOx layer 36 is etched by using a buffered HF solution to expose contact hole portions of TaOx layers 34a, 34b, 34c. Thereafter, the exposed part of TaOx layers are etched by a CDE method, as mentioned above, to expose underlying surface portions of the tantalum layers 32a, 32b, 32c.

To etch the exposed portions of the TaOx layers, the substrate 30, with the layers thereon, is placed in a chamber such as that described above with the reference to FIG. 2. A gas mixture of CF$_4$/O$_2$ is used with a CF$_4$ flow rate of 180 sccm, an O$_2$ flow rate of 900 sccm, a temperature of substrate 30 at 100° C., and a microwave power of 600. During the etching step, the exposed contact hole portions of the TaOx layers 34a, 34b and 34c are selectively etched without or only slightly etching the under layer portions of tantalum 32a, 32b, and 32c.

After the etching steps, Mo and Al are sputter-evaporated on the substrate to form a source 44a, a drain 44b, a data line 44c, a contact portion 44d, and a stacked portion 44e on address line 32a. Then, n+ a-Si layer of a channel portion is etched with CDE.

In the conventional method, portions on which a contact hole is formed, are covered by a photo resist film not to be anodicoxidized. However, in the photo lithography process, defects caused by dust on the mask, such as electrical shorts between wires caused by the residual resist film, are generated. Therefore, a satisfactory yield cannot be obtained.

On the other hand, according to the first embodiment of the present invention, TaOx layers 34a, 34b, and 34c are etched against Ta layers 32a, 32b, and 32c in a high selectivity, by setting the flow ratio (O$_2$/CF$_4$) of the etching gas. Accordingly, the yield of manufacturing the device is improved. Also, as shown in FIG. 7, the Al/Mo layer 44e can be used to reduce the resistivity of the address line 32a by forming an elongated contact hole for the layer 44e or by forming multiple contact holes shunted by the layer 44e on the line 32a, for example. According to the conventional anodic oxidation method, using a resist film, the resistivity cannot be decreased because the citric acid liquid invades under the resist film and an anodic oxidation layer is formed on the material of the line 32a.

Figure 8A:
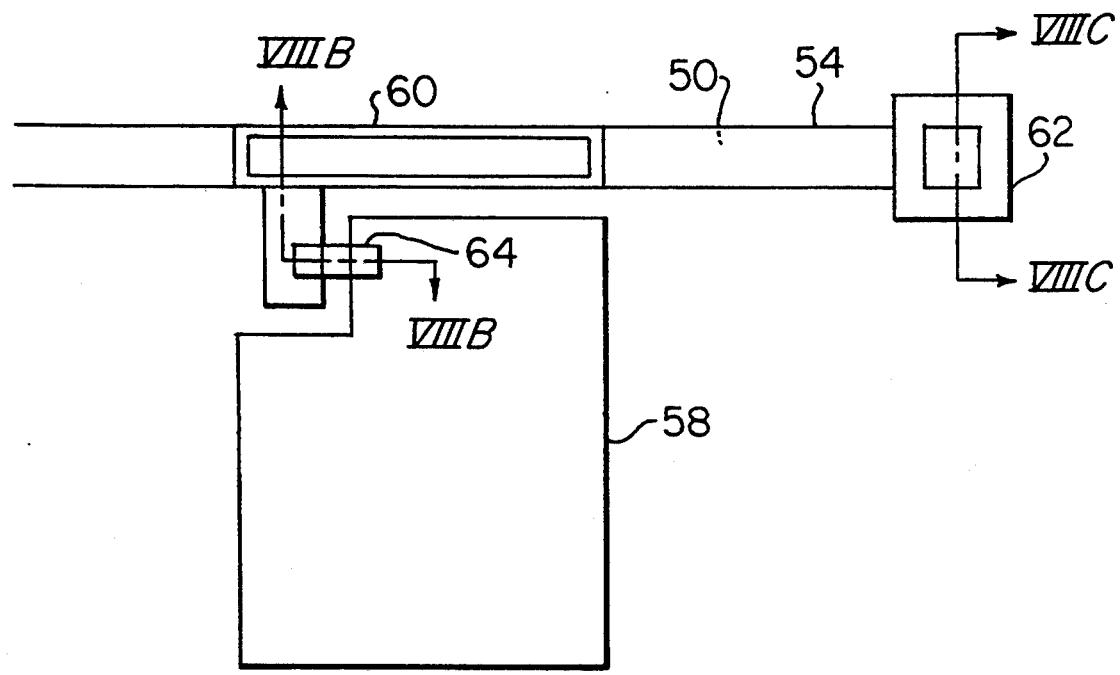
FIG. 8(a) is a fragmentary plan view illustrating a semiconductor device formed in a second embodiment of the invention.
Figure 8B:
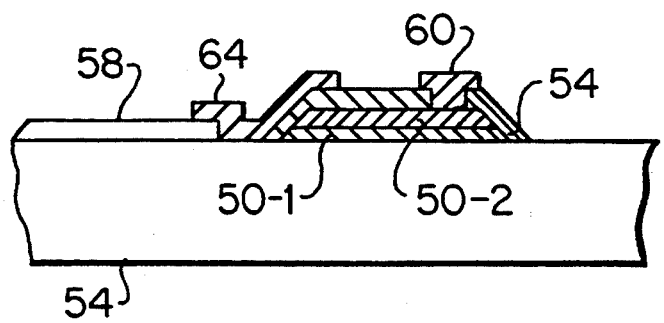
FIG. 8(b) is a fragmentary cross section on line VIIIB—VIIB of FIG. 8(a)
Figure 8C:
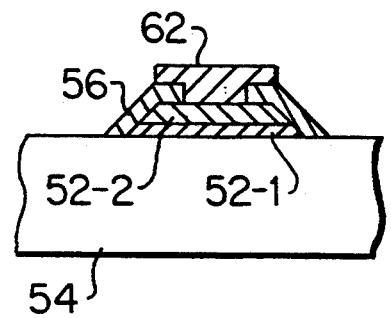
FIG. 8(c) is a fragmentary cross section on line VIIC—VIIC of FIG. 8 (a).

FIG. 8(a) is a plan view showing a second embodiment of the invention. The second embodiment is applicable to a method of manufacturing a liquid crystal display using metal insulator metal (MIM). FIG. 8(b) and FIG. 8(c), respectively, show sectional views of line A—A' and line B—B' in FIG. 8(a). In FIG. 8(a), 8(b) and 8(c), a 30 nm TaNx layer (N=43 atm %) and then a 220 nm Ta layer is formed on a glass substrate 54. These layers are patterned by a CDE method, to form underlying wires 50,52.

Next, the exposed surfaces of the underlying wires 50,52 are immersed in a 0.1% citric acid liquid and are oxidized in a constant current, as the voltage is increased up to 25 V, and then is oxidized at a constant voltage of 25 V for one hour to form anodic oxide layers 54,56. Then, a 100 nm ITO layer is deposited and is patterned to form a display electrode 58. As the next step, desired contact hole portions of anodic oxide layers 54,56 on underlying wires 50,52 are selectively etched according to a CDE method in a condition so that anodic oxide layers 54,56 can be fully etched with a high selectivity as against the TaNx layer 50-1, 50-2 and the Ta layer 52-1, 52-2.

The condition, for example, is that a mixture gas of O$_2$/C$_2$F$_6$ is used with an O$_2$ flow rate of 900 sccm, a C$_2$F$_6$ flow rate of 150 sccm, and a microwave power of 600 W. After these steps, a 100 nm Cr layer is formed on the substrate followed by the formation of an overlying wire 58 of an MIM device, a stacked Cr layer 60 to reduce a resistivity of wires, and a stacked Cr layer 62 on the contact portion.

According to the second embodiment, as anodic oxide layer (TaOx) 54, 56 on Ta layer 52 can be selectively etched against TaN layer 50 and Ta layer 52, contact holes can be reproducibly formed.

Therefore, a protection of the surface of the anodic oxidation can be realized and a yield of manufacturing device can be improved.

Other considerable modifications are contemplated as being within the scope of the invention. In the above embodiments, for example, a down flow type of CDE apparatus is used, but a plasma etching apparatus, such that an etching gas is activated by a plasma discharge and the activated gas is introduced into a chamber, separately from the gas activating portion, can be applicable to the embodiments without any damage to the substrate.

Also, the method according to the invention is applicable to manufacturing a capacitor, such as a Ta capacitor using a TaOx layer as well as a TFT array. A layer to be etched, according to the invention, may be anodic oxide layers of a Ta—N alloy, a Mo—Ta alloy, a Ta—W alloy, a Ta—Nb alloy, and an alloy of these materials or anodic oxide layers of a nitride layer of a Mo—Ta alloy, a Ta—W alloy, a Ta—Nb alloy, and an alloy of these materials.

A structure of wires (metal materials) may be Ta, Ta—W, Ta—Mo, Ta—Nb, or an alloy of these materials or a stacked layer which comprises these materials and a nitride layer of these materials. In this case, at least a surface of these metal materials may be covered by an anodic oxide layer. Also, instead of an anodic oxide layer, a thermal oxide layer, a CVD layer, or an evaporated layer could be used.

Moreover, the method according to the invention is applicable to etching an anodic oxide layer of the metal or alloy described above on a substrate such as a Si substrate. For example, a selective etching of a capacitor insulating layer, such as Ta$_2$O$_5$ layer of a DRAM against a Si substrate can be carried out. Etching of a mixed pattern comprising a Ta alloy and the oxide layer of the Ta alloy can be carried out.

A solution used in an anodic oxidization is not limited to a citric acid, but a phosphoric acid, an acetic acid, an oxalic acid, or a liquid added to an alcohol or a glycol to these acids, can be used. This invention is not limited to anodic oxide on Ta alloys. Thermal oxide or oxide formed by other methods like CVD and plasma oxidation, on Ta alloy can be applicable.

The structure of the TFT is also not limited to the embodiment, but a structure having an etching stopper over the channel region can be applicable. Also, the gate or the Cs line are not limited to the single Ta layer, but a stacked layer having the alloy described above. The gate insulator is not limited to $SiO_2$ and other materials like SiNx can be used.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device comprising steps of:
   providing a substrate comprising a metal material including a tantalum or an alloy mainly containing a tantalum thereon;
   forming on the substrate an oxide layer of said metal material to provide a composite of the substrate and the oxide layer;
   placing the composite into a first chamber;
   activating an etching gas, including a fluorine containing gas and an oxygen containing gas, in a second chamber;
   introducing the activated etching gas into the first chamber; and
   etching the oxide layer by the introduced gas selectively as against the metal material of the substrate.

2. A method according to claim 1, wherein the fluorine containing gas is freon.

3. A method according to claim 2, wherein the freon gas is $CnF_{2n+2}$ ($n \geq 1$).

4. A method according to claim 1, wherein the activating step includes supplying power to activate the etching gas in a discharge tube.

5. A method according to claim 4, wherein the power supplied is in the range of from 500 W to 800 W.

6. A method according to claim 1, further comprising a step of controlling temperature to maintain the temperature of the substrate in the range of from room temperature to 150° C. during the etching step.

7. A method according to claim 1, wherein the substrate is silicon.

8. A method of manufacturing a semiconductor device comprising steps of:
   providing a substrate;
   forming on the substrate an oxide layer of a metal material including one of tantalum and an alloy mainly containing a tantalum to provide a composite of the substrate and the oxide layer;
   placing the composite into a first chamber;
   activating an etching gas, including a fluorine containing gas and an oxygen containing gas, in a second chamber;
   introducing the activated etching gas into the first chamber; and
   etching the oxide layer by the introduced gas selectively as against the substrate,
   the activating step including adjusting a flow ratio of oxygen containing gas to fluorine containing gas to more than 2.

9. A method of manufacturing a liquid crystal display device comprising the steps of:
   providing a substrate including a metal material including one of tantalum and an alloy mainly containing a tantalum thereon;
   forming an anodic oxide layer of the tantalum included in the substrate;
   forming an etching mask on the anodic oxide layer;
   placing the substrate into a first region;
   activating a mixture of fluorine and oxygen containing gas in a second region, apart from the first region;
   introducing the activated etching gas into the first region through a gas introducing portion; and
   etching the oxide layer on the substrate selectively as against the metal material included in the substrate, by using the etching mask.

10. A method according to claim 9, wherein gas including fluorine radicals is introduced into the first region during the introducing step.

11. A method according to claim 9, wherein the activated gas is introduced to the first region from the second region through a gas introducing tube.

12. A method according to claim 10, wherein the introducing step comprises selecting radicals from among the activated etching gas by determining a length of the gas introducing tube, such that the radicals are selectively carried into the first region.

13. A method according to claim 9, wherein the activated etching gas is introduced into the first region through a mesh of metal separating the first region and the second region.

14. A method according to claim 9, wherein the fluorine containing gas is freon gas.

15. A method according to claim 9, wherein the etching gas is activated in a discharge tube to which power is applied in the range of from 500 W to 800 W.

16. A method according to claim 9, further comprising a step of controlling the temperature of the substrate to a range of from room temperature to 150° C. during the etching step.

17. A method according to claim 9, wherein the substrate is silicon.

18. A method of manufacturing a liquid crystal display device comprising the steps of:
   providing a substrate;
   forming an anodic oxide layer of a tantalum containing material on the substrate;
   forming an etching mask on the anodic oxide layer;
   placing the substrate into a first region;
   activating a mixture of fluorine and oxygen containing gas in a second region, apart from the first region;
   introducing the activated etching gas into the first region through a gas introducing portion; and
   etching the oxide layer on the substrate selectively as against the substrate, by using the etching mask, the activating step including adjusting to more than 2, a flow ratio of the oxygen containing gas to the fluorine containing gas.

19. A method of selectively etching a metal oxide on a metal with an oxide etching rate faster than metal, said method comprising steps of:
- forming an oxide layer on a metal material including one of tantalum and an alloy mainly containing a tantalum to provide a composite;
- placing the composite into a first chamber;
- activating an etching gas, including a fluorine containing gas and an oxygen containing gas, in a second chamber;
- introducing the activated etching gas into the first chamber; and
- etching the oxide layer by the introduced gas selectively as against the metal.

20. A method of selectively etching a metal oxide on a metal with an oxide etching rate faster than metal, said method comprising steps of:
- forming an oxide layer on a metal material including one of tantalum and an alloy mainly containing a tantalum to provide a composite;
- placing the composite into a closed chamber;
- activating an etching gas including a fluorine containing gas and an oxygen containing gas to produce fluorine and oxygen radicals including at least electrical neutral radicals; and
- introducing only the electrical neutral radicals into the chamber.

* * * * *